United States Patent
Hsu et al.

(10) Patent No.: US 10,283,442 B2
(45) Date of Patent: May 7, 2019

(54) INTERPOSER SUBSTRATE AND METHOD OF FABRICATING THE SAME

(71) Applicant: PHOENIX PIONEER TECHNOLOGY CO., LTD., Hsinchu County (TW)

(72) Inventors: Che-Wei Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 173 days.

(21) Appl. No.: 14/957,848

(22) Filed: Dec. 3, 2015

(65) Prior Publication Data

US 2016/0163627 A1    Jun. 9, 2016

(30) Foreign Application Priority Data

Dec. 3, 2014   (CN) .......................... 2014 1 0727413

(51) Int. Cl.
| | |
|---|---|
| *H01L 23/498* | (2006.01) |
| *H01L 21/48* | (2006.01) |
| *H01L 21/683* | (2006.01) |
| *H05K 3/00* | (2006.01) |

(52) U.S. Cl.
CPC .... *H01L 23/49822* (2013.01); *H01L 21/4857* (2013.01); *H01L 21/6835* (2013.01); *H05K 3/007* (2013.01); *H01L 2221/68345* (2013.01); *H01L 2221/68377* (2013.01); *H01L 2224/16* (2013.01); *H01L 2924/181* (2013.01)

(58) Field of Classification Search
CPC .................................................. H01L 23/49822
USPC .......................................................... 257/686
See application file for complete search history.

(56) References Cited

U.S. PATENT DOCUMENTS

| | | | | |
|---|---|---|---|---|
| 2011/0285005 A1* | 11/2011 | Lin | ..................... | H01L 21/4846 257/686 |
| 2015/0008587 A1* | 1/2015 | Lin | ....................... | H01L 21/486 257/774 |
| 2015/0126030 A1* | 5/2015 | Yang | ................. | H01L 21/76879 438/675 |
| 2015/0156883 A1* | 6/2015 | Bong | ................... | H05K 3/4007 174/266 |

(Continued)

*Primary Examiner* — Stanley Tso
(74) *Attorney, Agent, or Firm* — Amin, Turocy & Watson LLP

(57) ABSTRACT

An interposer substrate includes a first insulating layer having opposite first and second surfaces; a first wiring layer formed in the first insulating layer, with a surface of the first wiring layer exposed from the first surface; first conductive pillars formed in the first insulating layer; a second wiring layer formed on the second surface; second conductive pillars formed on the second wiring layer; a second insulating layer formed on the second surface and covering the second conductive pillars and the second wiring layer, with end surfaces of the second conductive pillars exposed from the second insulating layer; and immersion tin layers formed on the first wiring layer and the end surfaces of second conductive pillars. The immersion tin layers are used as surface processing layers to be applied to products having ball pads that need to be exposed extensively. A method for fabricating the interposer substrate is also provided.

12 Claims, 4 Drawing Sheets

(56) References Cited

U.S. PATENT DOCUMENTS

2015/0282317 A1* 10/2015 Gonya .................. H05K 3/403
174/262

* cited by examiner

INTERPOSER SUBSTRATE AND METHOD OF FABRICATING THE SAME

BACKGROUND OF THE INVENTION

1. Field of the Invention

The present invention relates to interposer substrates, and, more particularly, to an interposer substrate used in stacked packages and a method of fabricating the same.

2. Description of Related Art

With the advancement in semiconductor packaging technology, various types of packages of the semiconductor device have been developed, in order to increase electrical functionality and reduce packaging space. For instance, a Package on Package (PoP) is developed having multiple packaging structures stacked on one another. This type of package having the property of heterogeneous integration of a System in Package (SiP) incorporates and integrates various electronic components of different functions such as: memory, central processing unit, graphic processor, image processor etc., in a package through stacking, and is thus very suitable to be used in various low-profile electronic products.

Earlier stacked packages are formed by stacking memory packages (memory IC) over the logic packages (logic IC) via a plurality of solder balls. As the demand for light-weight and low-profile electronic products grows, the density of wiring on the memory package increases. The memory package is measured in nanometers, and the distances between the contact points are further shortened. However, the distances between the logic packages are measured in micrometers, and the logic packages cannot be miniaturized any further to comply with the distances between the memory packages. As a result, even a memory package with high density wiring is provided, there is no suitable logic package to go in concert with the memory package, thereby unable to achieve efficient production of the electronic products.

Accordingly, in order to overcome the above mentioned drawbacks, an interposer substrate is disposed between the memory package and logic package. For example, the bottom of the logic package is coupled to the logic package having logic chips with high distance, while the top terminal of the interposer substrate is coupled to a memory package having a memory chip of smaller distance.

FIG. 1 shows a schematic cross-sectional view of a conventional interposer substrate 1. The interposer substrate 1 comprises a first insulating layer 13, a first wiring layer 11, a plurality of first conductive pillars 12, a second wiring layer 14, a plurality of second conductive pillars 15, a second insulating layer 16, and surface processing layers 17,17'. The first insulating layer 13 has a first surface 13a and an opposing second surface 13b. The first wiring layer 11 is embedded in the first insulating layer 13 and exposed from the first surface 13a, for the chip mounting pads to be mounted thereon. The first conductive pillars 12 are formed in the first insulating layer 13 and the first wiring layer 11. The second wiring layer 14 is formed on the second surface 13b of the first insulating layer 13 and the first conductive pillars 12. The second conductive pillars 15 are formed on the second wiring layer 14. The second insulating layer 16 is formed on the second surface 13b of the first insulating layer 13 and encapsulates the second wiring layer 14 and the second conductive pillars 15, with a portion of the surfaces of the second conductive pillars 15 exposed from the second insulating layer 16 and serving as solder ball pads. The surface processing layer 17 is formed on the exposed surfaces of the first wiring layer 11 and the second conductive pillars 15.

However, in the method of fabricating the conventional interposer substrate 1, the surface processing layers 17 and 17' are made of an organic solderability preservative (OSP), which are not suitable to be used for products wherein the solder pads (i.e., the second conductive pillars 15) must be exposed under normal circumstances, such as in land grid array (LGA).

If the surface processing layer 17 of the solder pads is made of ENEPIG or Ni/Au, the following problems will occur.

First, it is required to select the process (i.e., to perform two surface processing processes, one with forming the surface processing layer 17 with OSP, the other with forming the surface processing layer 17 with ENEPIG or Ni/Au, which requires covering with resist layer during the process, thereby causing precipitation of the resist material, and resulting in poor reliability.

Second, it is difficult to control the intermetallic compound (IMC) and a problem of nickel barrier may occur.

Hence, there is an urgent need to solve the foregoing problems encountered in the prior art.

SUMMARY OF THE INVENTION

In view of the foregoing drawbacks, the present invention provides an interposer substrate, comprising: a first insulating layer having a first surface and an opposing second surface; a first wiring layer formed in the first insulating layer and having a surface exposed from the first surface of the first insulating layer; a plurality of first conductive pillars formed in the first insulating layer and on the first wiring layer, with end surfaces thereof exposed from the second surface of the first insulating layer; a second wiring layer formed on the second surface of the first insulating layer and the first conductive pillars and electrically connected with the first conductive pillars; a plurality of second conductive pillars formed on the second wiring layer and electrically connected with the second wiring layer; a second insulating layer formed on the second surface of the first insulating layer and covering the second conductive pillars and the second wiring layer, with end surfaces of the second conductive pillars exposed from the second insulating layer; and a plurality of immersion tin layer formed on the exposed surface of the first wiring layer and the end surfaces of the second conductive pillars.

The present invention further provides a method of fabricating an interposer substrate, comprising: forming a first wiring layer on a carrier, and forming a plurality of first conductive pillars on the first wiring layer; forming on the carrier a first insulating layer that has a first surface and an opposing second surface, with the first surface of the first insulating layer coupled to the carrier, and end surfaces of the first conductive pillars exposed from the second surface of the first insulating layer; forming on the second surface of the first insulating layer and the first conductive pillars a second wiring layer that is electrically connected with the first conductive pillars; forming on the second wiring layer a plurality of second conductive pillars electrically connected with the second wiring layer; forming on the second surface of the first insulating layer a second insulating layer that covers the second conductive pillars and the second wiring layer, with end surfaces of the second conductive pillars exposed from the second insulating layer; removing the carrier, with a surface of the first wiring layer exposed from the first surface of the first insulating layer; and forming an immersion tin layer on the exposed surface of the first wiring layer and the end surfaces of the second conductive pillars.

In an embodiment, a portion or the entire carrier is removed.

In an embodiment, the first insulating layer is formed on the carrier by a molding, a coating or a lamination method, and the first insulating layer is made of a molding compound, a primer, or a dielectric material.

In an embodiment, the surface of first wiring layer is lower than the first surface of the first insulating layer.

In an embodiment, the end surfaces of the first conductive pillars are flush with the second surface of the first insulating layer.

In an embodiment, the end surfaces of the second conductive pillars serve as solder ball implanting surfaces.

In an embodiment, the end surfaces of the second conductive pillars are flush with the surface of the second insulating layer.

In an embodiment, the second insulating layer is formed on the carrier by a molding, a coating or a lamination method, and the first insulating layer is made of a molding compound, a primer, or a dielectric material.

In an embodiment, the surface of the immersion tin layer is flush with or lower than the first surface of the first insulating layer.

In an embodiment, the surface of the immersion tin layer is higher than the first surface of the first insulating layer. In an embodiment, the surface of the immersion tin layer is flush with or lower than the first surface of the second insulating layer.

In an embodiment, the surface of the immersion tin layer is higher than the first surface of the second insulating layer.

In addition, in an embodiment, a portion of the carrier is removed, with the remaining carrier serving as a supporting structure.

In summary, in the interposer substrate and the method of fabricating the same according to the present invention, the immersion tin layer which serves as a surface processing layer is suitable to be used in a product wherein the solder ball pads are exposed for a lengthy period of time, without the need of selecting process, such that the fabricating method of the present invention is simplified. Moreover, the ease of controlling the intermetallic compound (IMC) without nickel barrier problem also facilitates enhanced product reliability.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "top", "first", "second" and "one" etc., are merely for illustrative purpose and should not be construed to limit the scope of the present invention.

FIGS. 2A-2F are cross-sectional views showing a method of fabricating a coreless interposer substrate 2 according to the present invention. In an embodiment, the interposer substrate 2 is a carrier used in a flip-chip chip scale package (FCCSP).

Figure 1:
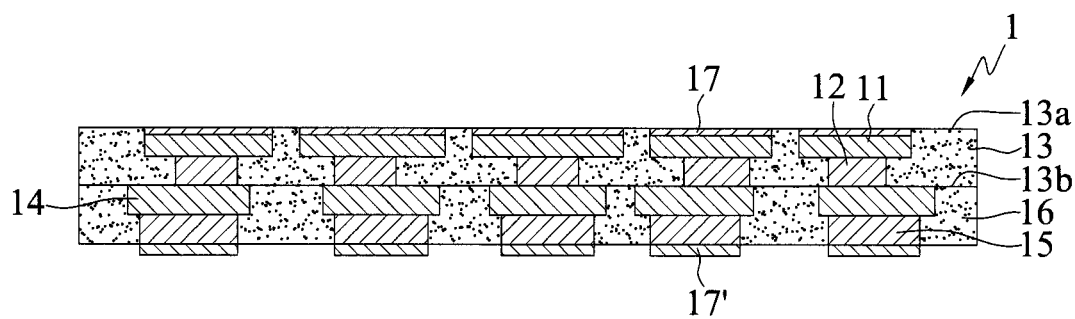
FIG. 1 is a schematic cross-sectional view of a conventional interposer substrate.
Figure 2A:
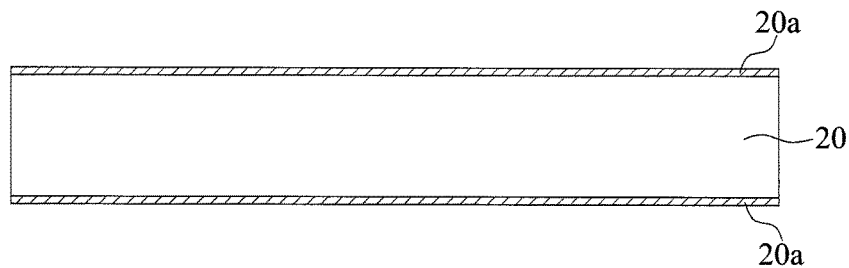
FIGS. 2A-2F are schematic cross-sectional view of an interposer substrate according to the present invention; wherein FIG. 2F' is another example of FIG. 2F.

As shown in FIG. 2A, a carrier 20 is provided. In an embodiment, the carrier 20 is a substrate material, such as a copper foil substrate, but is not limited thereto. The copper foil substrate has a metal material 20a on the two sides thereof, and is used to exemplify the present embodiment.

Figure 2B:
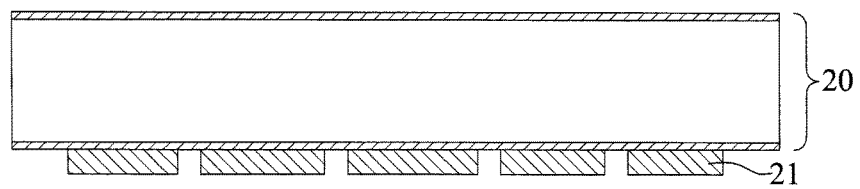
Figure 2C:
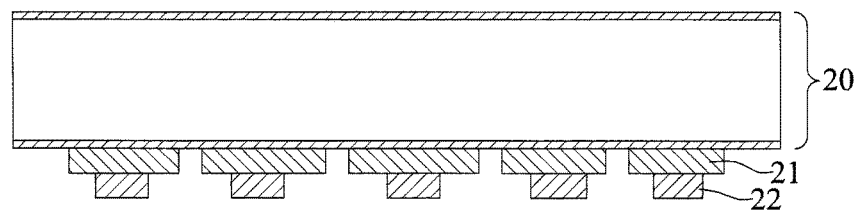

As shown in FIG. 2B, a first wiring layer 21 is formed on the carrier 20 by a patterning process. As shown in FIG. 2C, a plurality of first conductive pillars 22 are electroplated to be formed on the first wiring layer 21 by a patterning process.

In an embodiment, the first conductive pillars 22 contact and are electrically connected with the first wiring layer 21.

Figure 2D:
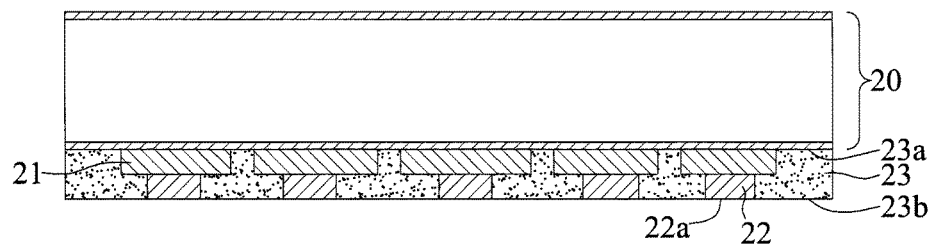

As shown in FIG. 2D, a first insulating layer 23 is formed on the carrier 20. The first insulating layer 23 has a first surface 23a and an opposing second surface 23b, and is coupled to the carrier 20 via the first surface 23a thereof. The end surfaces of the first conductive pillars 22 are exposed from the second surface 23b of the first insulating layer 23.

In an embodiment, the first insulating layer 23 is formed on the carrier 20 by a molding, a coating, or a lamination method, and the first insulating layer 23 is made of a molding compound, a primer, or a dielectric material such as epoxy.

Further, the end surfaces 22a of the first conductive pillars 22 are flush with the second surface 23b of the first insulating layer 23.

Figure 2E:
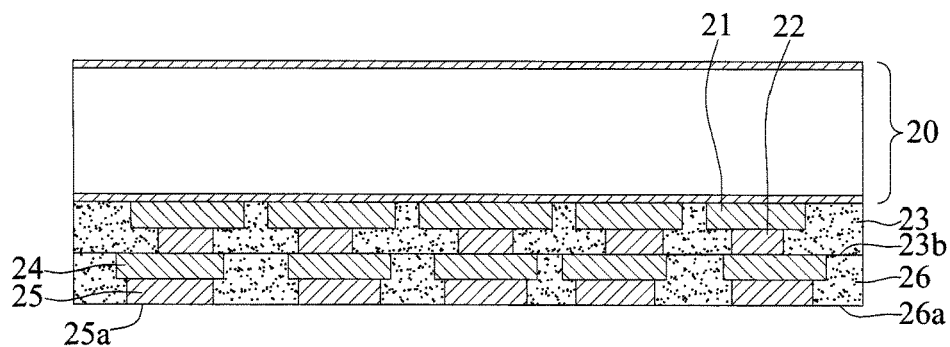

As shown in FIG. 2E, a second wiring layer 24 is formed on the second surface 23b of the first insulating layer 23 and the first conductive pillars 22, and is further formed with a plurality of second conductive pillars 25 on the second wiring layer 24. The second wiring layer 24 is electrically connected with the second conductive pillars 25. A second insulating layer 26 is formed on the second surface 23b of the first insulating layer 23, and encapsulates the second conductive pillars 25 and the second wiring layer 24.

In an embodiment, the end surfaces 25a of the second conductive pillars 25 are exposed from the second insulating layer 26, serving as solder ball implantation surfaces. In an embodiment, the end surfaces 25a of the second conductive pillars 25 are flush with the surface 26a of the second insulating layer 26.

Further, the second insulating layer 26 is formed by a molding, a coating, or a lamination method, and the second insulating layer 26 is made of a molding compound, a primer, or a dielectric material.

Figure 2F:
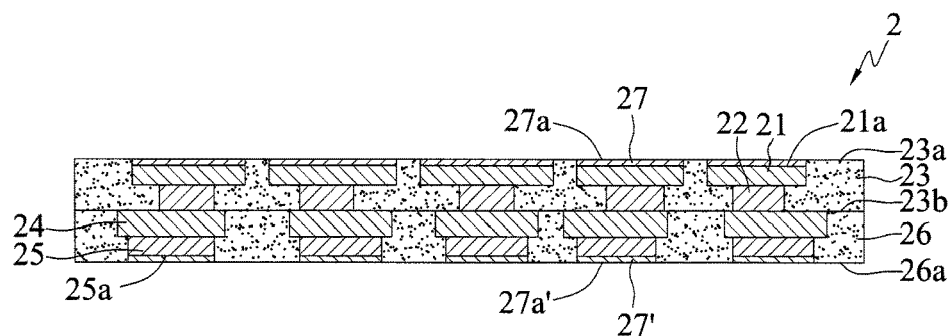
Figure 2F:
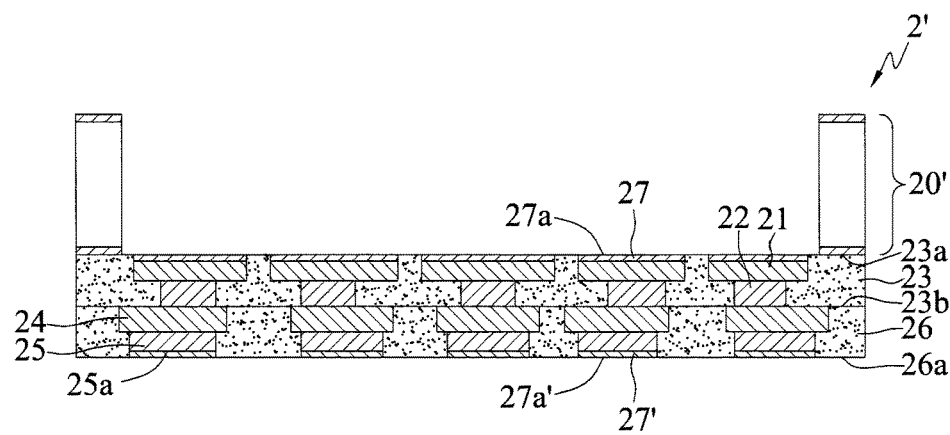

As shown in FIG. 2F, the entire carrier 20 is removed, such that the surface 21a of the first wiring layer 21 is exposed from the first surface 23a of the first insulating layer 23, and the surface 21a of the first wiring layer 21 is lower than the first surface 23a of the first insulating layer 23. Subsequently, immersion tin layers 27, 27' are formed on the surface 21a of the first wiring layer 21 and the end surfaces 25a of the second conductive pillars 25, respectively.

In an embodiment, an etching method is used to remove the metal material 20a, and the surface 21a of the first wiring layer 21 is slightly etched away, such that the surface 21a of the first wiring layer 21 is slightly recessed on the first surface 23a of the insulating layer 23.

Further, when the metal material 20a is etched, the end surfaces of the second conductive pillars 25 will also be slightly etched away, such that the end surfaces 25a of the second conductive pillars 25 is lower than the surface 26a of the second insulating layer 26. In addition, the surface 27a of one side of the immersion tin layer 27 may be higher than, lower than or flush with the first surface 23a of the first insulating layer 23. Alternatively, the surface 27a of the other side of the immersion tin layer 27' may be higher than, lower than or flush with the surface 26a of the second insulating layer 26.

As shown in FIG. 2F', a portion of the carrier 20 is etched away, such that the remaining portion of the carrier serves as a supporting structure 20'.

Figure 2G:
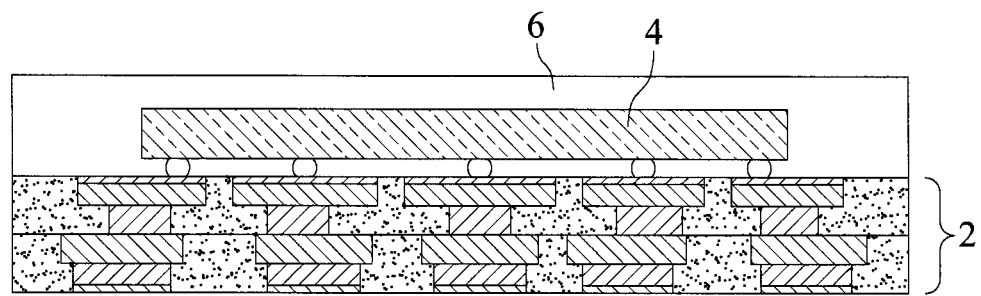
FIGS. 2G and 2G' are schematic cross-sectional views showing the subsequent processes of FIG. 2F.
Figure 2G:
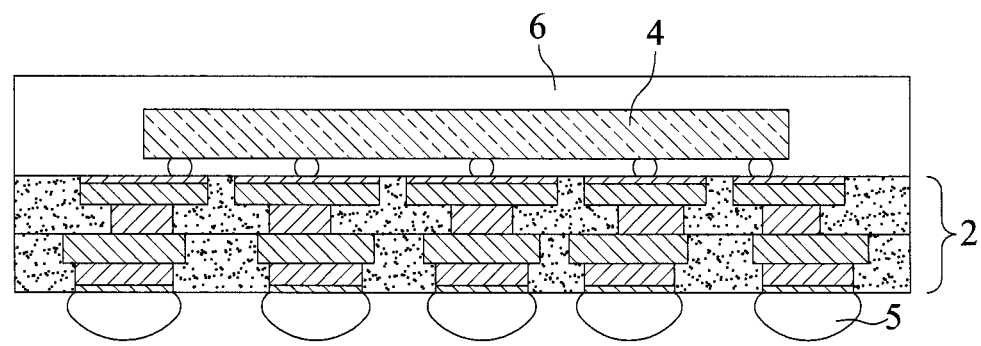

In the subsequent processes, as shown in FIG. 2G, an electronic element 4 is formed on the first surface 23a of the first insulating layer 23 electrically connected with the first wiring layer 21, and is then encapsulated by an encapsulant 6 to complete the formation of the LGA (land grid array) product. Alternatively, as shown in FIG. 2G', the electronic element 4 is formed on the first surface 23a of the first insulating layer 23, and is electrically connected with the first wiring layer 21, and a plurality of solder balls 5 are formed on the immersion tin layer 27' of the second conductive pillars 25, so as to complete the formation of a BGA (ball grid array) product.

Accordingly, the method according to the present invention features on immersion tin layers 27 and 27' to serve as surface processing layers, which are suitable to be used in a product wherein the solder ball pads are exposed for a lengthy period of time, such as LGA (land grid array) product.

Moreover, the ease of controlling the intermetallic compound (IMC) without nickel barrier problem also simplifies the fabricating process and facilitates enhanced product reliability.

The present invention further provides an interposer substrate 2, 2', comprising: a first insulating layer 23, a first wiring layer 21, a plurality of first conductive pillars 22, a second wiring layer 24, a plurality of second conductive pillars 25, a second insulating layer 26, and an immersion tin layer 27.

The first insulating layer 23 has a first surface 23a and an opposing second surface 23b, and the first insulating layer 23 is a molding compound, epoxy resin or a dielectric material.

The first wiring layer 21 is embedded in the first surface 23a of the first insulating layer 23, and the surface 21a of the first wiring layer 21 is lower than the first surface 23a of the first insulating layer 23.

The first conductive pillars 2 are formed in the first insulating layer 23 and coupled to the second surface 23b of the first insulating layer 23, and the end surfaces 22a of the first conductive pillars 22 are flush with the second surface 23b of the first insulating layer 23.

The second wiring layer 24 is formed on the second surface 23b of the first insulating layer 23 and the first conductive pillars 22 and electrically connected with the first conductive pillars 22.

The second conductive pillars 25 are formed on and electrically connected with the surface 24a of the second wiring layer 24, and the end surfaces 25a of the second conductive pillars 25 serve as solder ball implantation surfaces.

The second insulating layer 26 is formed on the second surface 23b of the first insulating layer 23, and covers the second wiring layer 24 and the second conductive pillars 25, and the end surfaces 25a of the second conductive pillars 25 are exposed from the second insulating layer 26.

The immersion tin layers 27 and 27' are formed on the surface 21a of the first wiring layer 21 and the end surfaces 25a of the second conductive pillars 25. In an embodiment, the immersion tin layer 27 is higher than or flush with the first surface 23a of the first insulating layer 23.

In an embodiment, the immersion tin layer 27' is higher than or flush with the surface 26a of the second insulating layer 26.

In an embodiment, the interposer substrate 2' further comprises a supporting structure 20', which is formed on the first surface 23a of the first insulating layer 23.

In summary, the interposer substrate and the method of fabricating the same according to the present invention are applied in products with stacked structures having fine pitches and high lead numbers, such as smart phones, tablets, internets, laptops, and particularly is used in products requiring high speed operation, compact size, high functionality and high storage.

Further, the interposer substrate 2, 2' according to the present invention is coupled to a logic package or memory package via the first wiring layer 21 and the second conductive pillars 25.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. An interposer substrate, comprising:
   a first insulating layer having a first surface and an opposing second surface;
   a first wiring layer formed in the first insulating layer and having a surface exposed from the first surface of the first insulating layer;
   a plurality of first conductive pillars formed in the first insulating layer and on the first wiring layer, each of the first conductive pillars having an end surface exposed from the second surface of the first insulating layer, wherein each of the first conductive pillars has a side surface adjacent to the end surface and the side surface is vertical to the end surface;
   a second wiring layer formed on the second surface of the first insulating layer and the first conductive pillars and electrically connected with the first conductive pillars via the exposed end surfaces thereof;
   a plurality of second conductive pillars formed on the second wiring layer and electrically connected with the second wiring layer;
   a second insulating layer formed on the second surface of the first insulating layer and covering the second conductive pillars and the second wiring layer, with end surfaces of the second conductive pillars exposed from the second insulating layer;

a first immersion tin layer formed on and in direct contact with the surface of the first wiring layer, wherein a width of the first immersion tin layer is equal to a width of the surface of the first wiring layer; and a second immersion tin layer formed on and in direct contact with the end surfaces of the second conductive pillars, wherein a width of the second immersion tin layer is equal to a width of at least one of the end surfaces of the second conductive pillars.

2. The interposer substrate of claim 1, wherein the first insulating layer is made of a molding compound, a primer, or a dielectric material.

3. The interposer substrate of claim 1, wherein the surface of the first wiring layer is lower than the first surface of the first insulating layer.

4. The interposer substrate of claim 1, wherein the end surfaces of the first conductive pillars are flush with the second surface of the first insulating layer.

5. The interposer substrate of claim 1, wherein the end surfaces of the second conductive pillars serve as solder ball implantation surfaces.

6. The interposer substrate of claim 1, wherein the end surfaces of the second conductive pillars are flush with a surface of the second insulating layer.

7. The interposer substrate of claim 1, wherein the second insulating layer is made of a molding compound, a primer, or a dielectric material.

8. The interposer substrate of claim 1, wherein the first immersion tin layer has a surface lower than or flush with the first surface of the first insulating layer.

9. The interposer substrate of claim 1, wherein the first immersion tin layer has a surface higher than the first surface of the first insulating layer.

10. The interposer substrate of claim 1, wherein the second immersion tin layer has a surface lower than or flush with a surface of the second insulating layer.

11. The interposer substrate of claim 1, wherein the second immersion tin layer has a surface higher than a surface of the second insulating layer.

12. The interposer substrate of claim 1, further comprising a supporting structure formed on the first surface of the first insulating layer.

\* \* \* \* \*